(12) United States Patent
Jeong

(10) Patent No.: US 11,322,097 B2
(45) Date of Patent: May 3, 2022

(54) ORGANIC LIGHT EMITTING DISPLAY DEVICE AND METHOD OF DRIVING THE SAME

(71) Applicant: Samsung Display Co., Ltd., Yongin-si (KR)

(72) Inventor: Heesoon Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 7 days.

(21) Appl. No.: 16/402,792

(22) Filed: May 3, 2019

(65) Prior Publication Data

US 2020/0013345 A1  Jan. 9, 2020

(30) Foreign Application Priority Data

Jul. 3, 2018  (KR) .................. 10-2018-0077131

(51) Int. Cl.
*G09G 3/3291* (2016.01)
*G09G 3/3266* (2016.01)
*G09G 3/3233* (2016.01)
*G09G 3/20* (2006.01)
*H01L 27/32* (2006.01)

(52) U.S. Cl.
CPC ......... *G09G 3/3291* (2013.01); *G09G 3/2003* (2013.01); *G09G 3/3233* (2013.01); *G09G 3/3266* (2013.01); *H01L 27/3276* (2013.01); *G09G 2300/043* (2013.01); *G09G 2300/0426* (2013.01); *G09G 2300/0452* (2013.01); *G09G 2300/0828* (2013.01); *G09G 2310/08* (2013.01)

(58) Field of Classification Search
None
See application file for complete search history.

(56) References Cited

U.S. PATENT DOCUMENTS

| 8,933,975 | B2 * | 1/2015 | Nakanishi | G09G 3/3426 |
| | | | | 345/694 |
| 9,035,976 | B2 | 5/2015 | Lee et al. | |
| 9,520,087 | B2 * | 12/2016 | Park | G09G 3/3233 |
| 10,198,994 | B2 * | 2/2019 | Choi | G09G 3/3258 |

(Continued)

FOREIGN PATENT DOCUMENTS

| JP | 2017-227755 A | 12/2017 |
| KR | 10-2014-0014671 A | 2/2014 |

(Continued)

*Primary Examiner* — Patrick N Edouard
*Assistant Examiner* — Peijie Shen
(74) *Attorney, Agent, or Firm* — Lewis Roca Rothgerber Christie LLP

(57) ABSTRACT

An organic light emitting display device includes: a display part comprising a plurality of pixel circuits, a pixel circuit from among the pixel circuits comprising: an organic light emitting diode; and a first transistor, the first transistor comprising a first electrode configured to receive a power source voltage and a second electrode connected to the organic light emitting diode; an initial voltage determiner configured to change a level of an initial voltage using image data of a frame; a sensor configured to apply the initial voltage to the second electrode of the first transistor; and a data driver configured to apply a data voltage to the control electrode of the first transistor.

20 Claims, 9 Drawing Sheets

(56) References Cited

U.S. PATENT DOCUMENTS

| | | | | |
|---|---|---|---|---|
| 2007/0075938 A1* | 4/2007 | Sung | G09G 3/3233 | 345/76 |
| 2007/0103601 A1* | 5/2007 | Izumi | G09G 3/20 | 348/687 |
| 2008/0211801 A1* | 9/2008 | Shiomi | G09G 3/3607 | 345/214 |
| 2010/0128024 A1* | 5/2010 | Bae | G09G 3/3413 | 345/214 |
| 2011/0115829 A1* | 5/2011 | Ito | G09G 3/3426 | 345/690 |
| 2011/0279444 A1* | 11/2011 | Chung | G09G 3/3233 | 345/214 |
| 2014/0028649 A1* | 1/2014 | Kim | G09G 3/3233 | 345/212 |
| 2014/0118409 A1* | 5/2014 | Jun | G09G 3/30 | 345/690 |
| 2014/0132583 A1* | 5/2014 | Kim | G09G 3/3233 | 345/212 |
| 2014/0152704 A1* | 6/2014 | Jeong | G09G 3/3233 | 345/690 |
| 2015/0022569 A1* | 1/2015 | Iguchi | G09G 3/3406 | 345/697 |
| 2015/0371605 A1* | 12/2015 | Wu | G09G 5/02 | 345/604 |
| 2016/0049134 A1* | 2/2016 | Lin | G09G 3/3406 | 345/690 |
| 2017/0034542 A1* | 2/2017 | Yabu | H04N 21/235 | |
| 2018/0005575 A1* | 1/2018 | Lee | G09G 3/3225 | |
| 2018/0053462 A1* | 2/2018 | Bae | G09G 3/3233 | |
| 2018/0336842 A1* | 11/2018 | Han | G09G 3/3685 | |
| 2018/0342189 A1* | 11/2018 | Xu | G09G 3/3208 | |
| 2018/0367776 A1* | 12/2018 | Arai | H04N 1/60 | |
| 2018/0374426 A1* | 12/2018 | Chen | G09G 3/3291 | |
| 2019/0073964 A1* | 3/2019 | Hong | G02F 1/1336 | |

FOREIGN PATENT DOCUMENTS

| | | |
|---|---|---|
| KR | 10-2014-0053606 A | 5/2014 |
| KR | 10-2018-0020359 A | 2/2018 |

\* cited by examiner

JXK BLOCKS

ORGANIC LIGHT EMITTING DISPLAY DEVICE AND METHOD OF DRIVING THE SAME

CROSS-REFERENCE TO RELATED APPLICATION

This application claims priority to and the benefit of Korean Patent Application No. 10-2018-0077131 filed on Jul. 3, 2018, the entirety of which is hereby incorporated by reference.

BACKGROUND

1. Field

Aspects of some example embodiments of the inventive concept relate to a display device and a method of driving the display device.

2. Description of the Related Art

Recently, organic light emitting display devices (e.g., an organic light emitting display apparatus) have become more widely used as a display device.

The organic light emitting display apparatus includes a plurality of pixels. Each of the plurality of pixels includes an organic light emitting diode and a pixel circuit driving the organic light emitting diode. The pixel circuit includes a plurality of transistors and a plurality of capacitors.

When the organic light emitting diode and a driving transistor driving the organic light emitting diode are operated for a long period of time, the organic light emitting diode and/or the driving transistor may become degraded. A display quality of an image displayed the organic light emitting display device may therefore be decreased by the degraded organic light emitting diode and/or the driving transistor.

The organic light emitting display device applies a reference signal to a pixel, receives a sensing signal from the pixel, and corrects pixel data of the pixel based on the sensing signal. A mode of compensating a degradation of the organic light emitting display device includes an inside compensation mode using an inside compensation circuit disposed in the pixel and an external compensation mode using an outside compensation circuit disposed out the pixel.

The Background section of the present Specification includes information that is intended to provide context to example embodiments, and the information in the present Background section does not necessarily constitute prior art.

SUMMARY

Aspects of some example embodiments of the inventive concept relate to a display device and a method of driving the display device. For example, some example embodiments of the inventive concept relate a display device for improving a display quality and a method of driving the display device.

Some example embodiments of the inventive concept provide an organic light emitting display device for improving a display quality.

Some example embodiments of the inventive concept provide a method of driving the organic light emitting display device.

According to some example embodiments of the inventive concept an organic light emitting display device includes: a display part comprising a plurality of pixel circuits, a pixel circuit comprising an organic light emitting diode and a first transistor, the first transistor comprising a first electrode receiving a power source voltage and a second electrode connected to the organic light emitting diode, an initial voltage determining part configured to change a level of an initial voltage using image data of a frame, a sensing part configured to apply the initial voltage to the second electrode of the first transistor, and a data driver configured to apply a data voltage to the control electrode of the first transistor.

According to some example embodiments, the pixel circuit may further includes a second transistor comprising a control electrode connected to a scan line, a first electrode connected to a data line and a second electrode connected to the control electrode of the first transistor, and a third transistor sensing comprising a control electrode connected to a sensing scan line, a first electrode connected to a sensing line and a second electrode connected to the second electrode of the first transistor.

According to some example embodiments, the pixel circuit may further include a storage capacitor connected between the control electrode of the first transistor and the second electrode of the first transistor.

According to some example embodiments, the sensing line may transfer the initial voltage to the pixel circuit, and a plurality of pixel circuits adjacent to the pixels circuit may share the sensing line.

According to some example embodiments, the organic light emitting display device may further include a first scan driver configured to generate a scan signal having a first on voltage period in which the second transistor is turned on, and apply the scan signal to the scan line, and a second scan driver configured to generate a sensing scan signal having a second on voltage period prior to the first on voltage period in which the third transistor is turned on, and apply the sensing scan signal. to the sensing scan line.

According to some example embodiments, the second on voltage period of the sensing scan signal may have a first period and a second period, the first period may be prior to the second on voltage period and the second period may be overlap with the second on voltage period.

According to some example embodiments, the initial voltage determining part may include a representative calculator configured to divide image data of the frame into a plurality of blocks and calculate a plurality of representative luminance values of the plurality of blocks, a luminance difference calculator configured to calculate a maximum luminance value and a minimum luminance value of the representative luminance values and calculate a luminance difference value between the maximum luminance value and the minimum luminance value, and a voltage level adjuster configured to adjust the level of the initial voltage based on the luminance difference value of the frame.

According to some example embodiments, the voltage level adjuster may be configured to decrease the level of the initial voltage when the luminance difference value of the frame increases, and configured to increase the level of the initial voltage when the luminance difference value of the frame decreases.

According to some example embodiments, the sensing part may be configured to receive a sensing signal corresponding to a threshold voltage of the first transistor from the pixel circuit, and to digital-to-analog convert the sensing signal to a sensing data.

According to some example embodiments, the organic light emitting display device may further include a timing controller configured to calculate a correction value for compensating the threshold voltage of the first transistor using the sensing data and to generate corrected image data based on the correction value.

According to some example embodiments, the initial voltage determining part may be configured to correct the level of the initial voltage based on the correction value.

According to some example embodiments of the inventive concept, there is provided method of driving an organic light emitting display device which comprises a display part comprising a plurality of pixel circuits, a pixel circuit comprising an organic light emitting diode and a first transistor, the first transistor comprising a first electrode receiving a power source voltage and a second electrode connected to the organic light emitting diode, the method including changing a level of an initial voltage using image data of a frame, applying the changed initial voltage the second electrode of the first transistor, and applying a data voltage to a control electrode of the first transistor.

According to some example embodiments, the pixel circuit may further include a second transistor including a control electrode connected to a scan line, a first electrode connected to a data line and a second electrode connected to a control electrode of the first transistor, and a third transistor sensing including a control electrode connected to a scan line, a first electrode connected to a sensing line and a second electrode connected to the second electrode of the first transistor, and the method may further include applying a scan signal having a first on voltage period in which the second transistor is turned on, to the scan line and applying a sensing scan signal having a second on voltage period prior to the first on voltage period in which the third transistor is turned on, to the sensing scan line.

According to some example embodiments, the second on voltage period of the sensing scan signal may have a first period and a second period, the first period may be prior to the second on voltage period and the second period may be overlapped with the second on voltage period.

According to some example embodiments, the initial voltage may be applied to the pixel circuit through the sensing line, and a plurality of pixel circuits adjacent to the pixels circuit may share the sensing line.

According to some example embodiments, the changing the level of an initial voltage may include dividing image data of the frame into a plurality of blocks and calculate a plurality of representative luminance values of the plurality of blocks, calculating a maximum luminance value and a minimum luminance value of the representative luminance values and calculate a luminance difference value between the maximum luminance value and the minimum luminance value and adjusting the level of the initial voltage based on the luminance difference value of the frame.

According to some example embodiments, the method may further include decreasing the level of the initial voltage when the luminance difference value of the frame increases, and increasing the level of the initial voltage when the luminance difference value of the frame decreases.

According to some example embodiments, the method may further include receiving a sensing signal corresponding to a threshold voltage of the first transistor from the pixel circuit and digital-to-analog converting the sensing signal to a sensing data.

According to some example embodiments, the method may further include calculating a correction value for compensating the threshold voltage of the first transistor using the sensing data and generating corrected image data based on the correction value.

According to some example embodiments, the method may further include correcting the level of the initial voltage based on the correction value.

According to some example embodiments of the inventive concept, the level of initial voltage applied to the pixel circuit is changed by every frame based on a luminance characteristic of a frame image and thus, a display quality may be improved.

BRIEF DESCRIPTION OF THE DRAWINGS

The above and other features and aspects of some example embodiments of the inventive concept will become more apparent by describing in more detail aspects of example embodiments thereof with reference to the accompanying drawings, in which.

DETAILED DESCRIPTION

Hereinafter, aspects of some example embodiments of the inventive concept will be explained in more detail with reference to the accompanying drawings.

Figure 1:
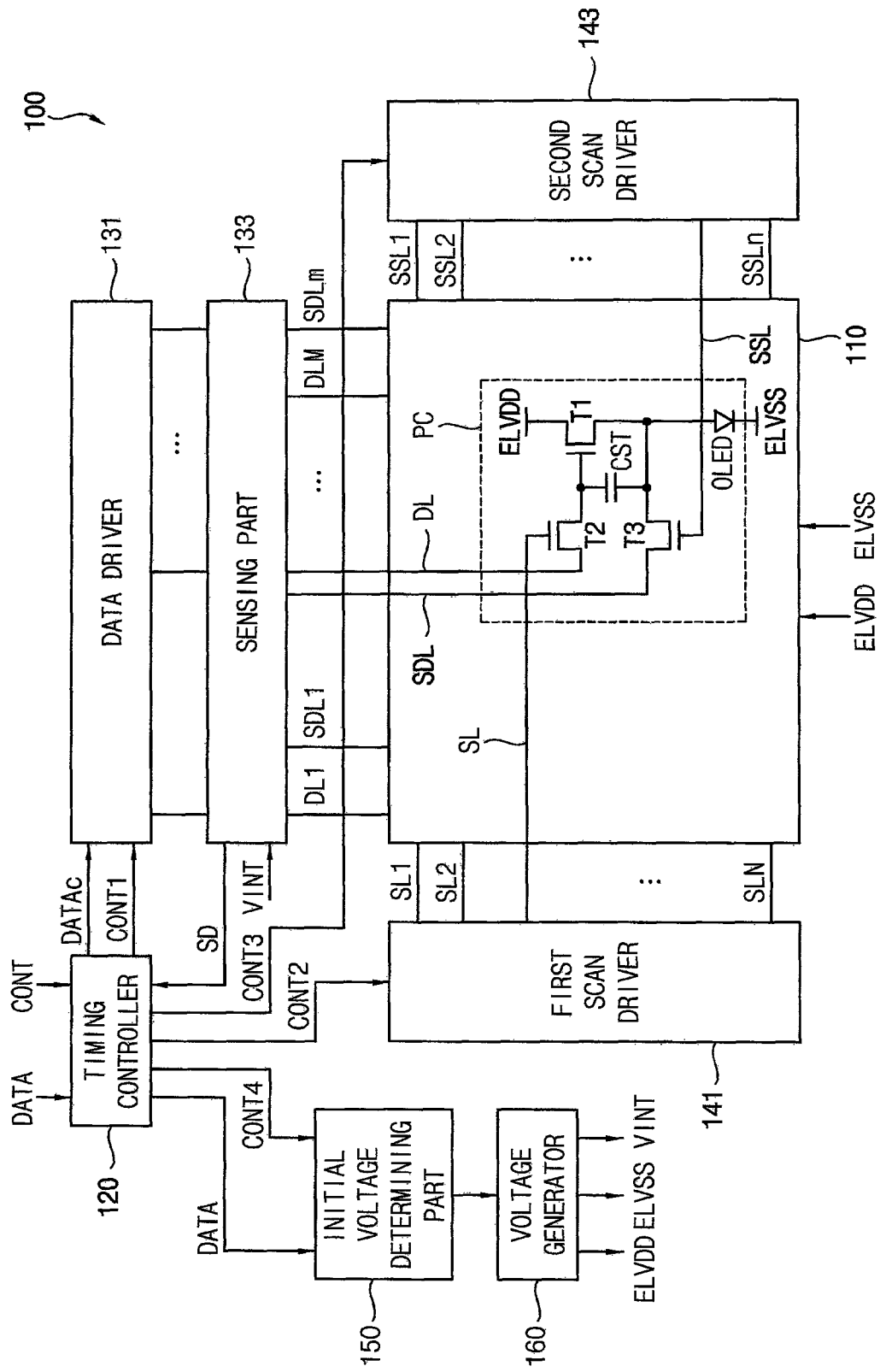
FIG. 1 is a block diagram illustrating an organic light emitting display device according to some example embodiments.

FIG. 1 is a block diagram illustrating an organic light emitting display device according to some example embodiments.

Referring to FIG. 1, an organic light emitting display device 100 may include a display part 110, a timing controller 120, a data driver 131, a sensing part (or sensor) 133, a first scan driver 141, a second scan driver 143, an initial voltage determining part (or initial voltage determiner, or initial voltage determining circuit) 150, and a voltage generator 160.

The display part 110 may include a plurality of pixels, a plurality of scan lines SL1, SL2, . . . , SLN, a plurality of sensing scan lines SSL1, SSL2, . . . , SSLn, a plurality of data lines DL1, DL2, . . . , DLM and a plurality of sensing lines SDL1, SDL2, . . . , SDLm (wherein, 'n', 'N', 'm' and 'M' are natural numbers).

The pixels may be arranged as a matrix type (or in a matrix configuration) which includes a plurality of pixel rows and a plurality of pixel columns. A pixel row may correspond to a horizontal line of the display part 110 and a pixel column may correspond to a vertical line of the display part 110.

Each pixel includes a pixel circuit PC, and the pixel circuit PC includes an organic light emitting diode OLED and a plurality of transistors driving the organic light emitting diode OLED.

For example, the pixel circuit PC includes a data line DL, a sensing line SDL, a scan line SL, a sensing scan line SSL, a first transistor T1, an organic light emitting diode OLED, a second transistor T2, a storage capacitor CST and a third transistor T3.

The data line DL is connected to the output terminal of the data driver 131 and transfers a data voltage to the pixel circuit PC.

The sensing line SDL is connected to the sensing part 133. The sensing line SDL may transfer an initial voltage VINT to the pixel circuit PC during an image display period and transfer a sensing signal sensed from the pixel circuit PC to the sensing part 133 during a sensing period.

The scan line SL is connected to an output terminal of the first scan driver 141, and transfers a scan signal generated from the first scan driver 141 to the pixel circuit PC. The scan signal includes a first on voltage period in which the second transistor T2 is turned on.

The sensing scan line SSL is connected to an output terminal of the second scan driver 143, and transfers a sensing scan signal generated from the second scan driver 143 to the pixel circuit PC. The sensing scan signal includes a second on voltage period in which the third transistor T3 is turned on.

The first transistor T1 includes a control electrode connected to the storage capacitor CST, a first electrode receiving a first power source voltage ELVDD and a second electrode connected to an anode electrode of the organic light emitting diode OLED.

The organic light emitting diode OLED includes an anode electrode connected to a second electrode of the first transistor T1 and a cathode electrode receiving a second power source voltage ELVSS.

The second transistor T2 includes a control electrode connected to a scan line SL, a first electrode connected to the data line DL and a second electrode connected to a control electrode of the first transistor T1.

The storage capacitor CST includes a first electrode connected to a control electrode of the first transistor T1 and a second electrode connected to the anode electrode of the organic light emitting diode OLED.

The third transistor T3 includes a control electrode connected to the sensing scan line SSL, a first electrode connected to a second electrode of the first transistor T1 and a second electrode connected to the sensing line SDL.

The timing controller 120 receives image data DATA and a control signal CONT from an external device. The timing controller 120 generates a plurality of control signals for driving the display device based on the control signal CONT.

The plurality of control signals may include a first control signal CONT1 controlling the data driver 131, a second control signal CONT2 controlling the first scan driver 141, a third control signal CONT3 controlling the second scan driver 143, and a fourth control signal CONT4 controlling the initial voltage determining part 150.

The data driver 131 digital-to-analog converts corrected image data DATAc received from the timing controller 120 to a data voltage and outputs the data voltage to the plurality of data lines DL1, DL2, . . . , DLM based on the first control signal CONT1.

The sensing part 133 analog-to-digital converts sensing signals received from the plurality of sensing lines SDL1, SDL2, . . . , SDLm to sensing data SD. The sensing part 133 provides the timing controller 120 with the sensing data SD.

According to some example embodiments, the timing controller 120 calculates a correction value for compensating a degradation of the pixel circuit PC based on the sensing data, and generates corrected image data DATAc using the correction value.

According to some example embodiments, the timing controller 120 may control the initial voltage determining part 150 so that a level of the initial voltage is corrected based on the correction value.

The first scan driver 141 generates a plurality of scan signals based on the second control signal CONT2, and may sequentially output the plurality of scan signals to the plurality of scan lines SL1, SL2, . . . , SLN. The scan signal includes a first on voltage period. The scan signal has a first on voltage for turning on the second transistor T2 in the pixel circuit PC during the first on voltage period.

The second scan driver 143 generates a plurality of sensing scan signals based on the third control signal CONT3, and may sequentially output the plurality of sensing scan signals to the plurality of sensing scan lines SSL1, SSL2, . . . , SSLn. The sensing scan signal includes a second on voltage period. The sensing scan signal has a second on voltage for turning on the third transistor T3 in the pixel circuit PC during the second on voltage period.

According to some example embodiments, the second on voltage period of the sensing scan signal applied to the pixel circuit PC includes a first period and a second period, the first period is prior to a first on voltage period of the scan signal and the second period overlaps with the first on voltage period.

The initial voltage determining part 150 divides image data DATA of the frame into a plurality of blocks, and calculates a plurality of block luminance values corresponding to the plurality of blocks, respectively.

The initial voltage determining part 150 calculates a maximum luminance value and a minimum luminance value using the plurality of block luminance values, and calculates a luminance difference value between the maximum luminance value and the minimum luminance value. The initial voltage determining part 150 determines a level of initial voltage VINT based on the luminance difference value by every frame.

The voltage generator 160 generates a plurality of driving voltages for driving the display part 110 using an external power source voltage. The plurality of driving voltages may include a first power source voltage ELVDD, a second power source voltage ELVSS and a plurality of initial voltages VINT.

According to some example embodiments, the voltage generator 160 may generate the initial voltage VINT corresponding to the level determined from the initial voltage determining part 150 by every frame. The voltage generator 160 may provide the sensing part 133 with the initial voltage VINT having the level determined by every frame.

According to some example embodiments, in the image display period, the level of initial voltage applied to the pixel circuit is changed by every frame based on a luminance characteristic of a frame image, which may improve the display quality.

Figure 2:
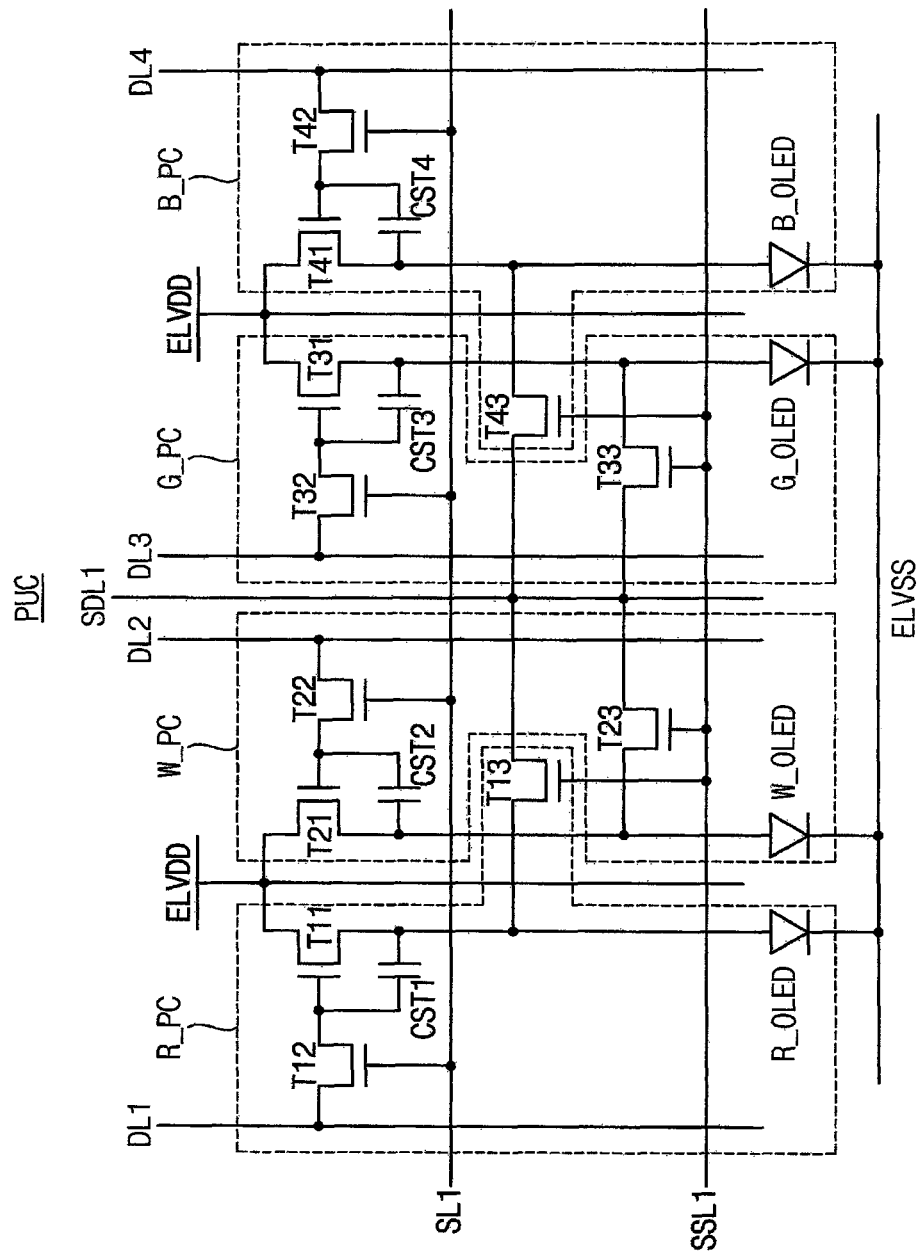
FIG. 2 is a circuit diagram illustrating an unit pixel circuit according to some example embodiments.
Figure 3:
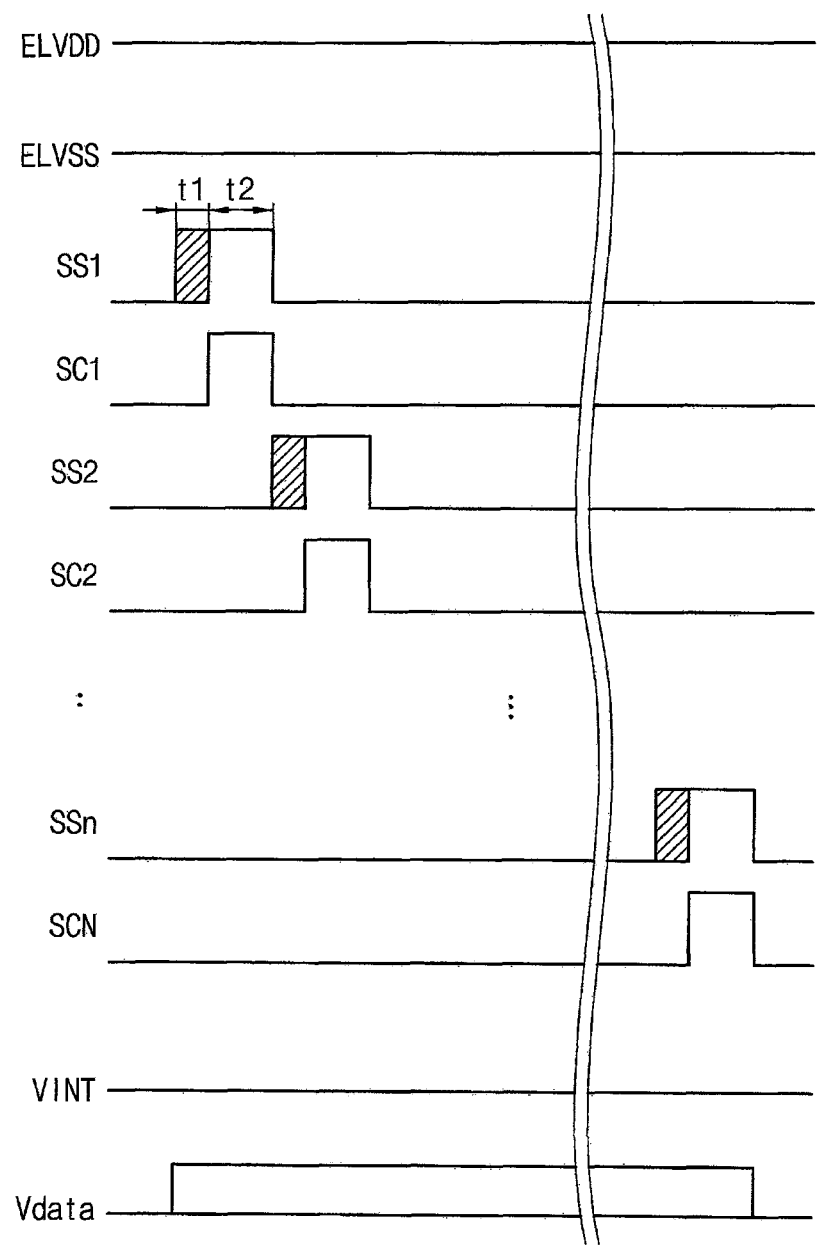
FIG. 3 is a timing diagram illustrating a method of driving an organic light emitting display device according to some example embodiments.

FIG. 2 is a circuit diagram illustrating a pixel circuit according to some example embodiments. FIG. 3 is a timing diagram illustrating a method of driving an organic light emitting display device according to some example embodiments.

Referring to FIG. 2, an unit pixel circuit PUC may include a plurality of color pixel circuits, and the plurality of color pixel circuits may share one sensing line.

For example, the unit pixel circuit PUC may include a red pixel circuit R_PC, a white pixel circuit W_PC, a green pixel circuit G_PC and a blue pixel circuit B_PC.

The red pixel circuit R_PC may include a first data line DL1, a first scan line SL1, a first sensing line SDL1, a first sensing scan line SSL1, a first transistor T11, a first organic light emitting diode R_OLED, a second transistor T12, a first storage capacitor CST1 and a third transistor T13.

The second transistor T12 is connected to a first scan line SL1, a first data line DL1 and a first transistor T11. The third transistor T13 is connected to a first sensing scan line SSL1, a first sensing line SDL1 and a first organic light emitting diode R_OLED.

The white pixel circuit W_PC includes a second data line DL2, a first scan line SL1, a first sensing line SDL1, a first sensing scan line SSL1, a first transistor T21, a second organic light emitting diode W_OLED, a second transistor T22, a second storage capacitor CST2 and a third transistor T23.

The second transistor T22 is connected to a first scan line SL1, a second data line DL2 and a first transistor T21. The third transistor T23 is connected to a first sensing scan line SSL1, a first sensing line SDL1 and a second organic light emitting diode W_OLED.

The green pixel circuit G_PC is connected to a third data line DL3, a first scan line SL1, a first sensing line SDL1, a first sensing scan line SSL1, a first transistor T31, a third organic light emitting diode G_OLED, a second transistor T32, a third storage capacitor CST3 and a third transistor T33.

The second transistor T32 is connected to a first scan line SL1, a third data line DL3 and a first transistor T31. The third transistor T33 is connected to a first sensing scan line SSL1, a first sensing line SDL1 and a third organic light emitting diode G_OLED.

The blue pixel circuit B_PC includes a fourth data line DL4, a first scan line SL1, a first sensing line SDL1, a first sensing scan line SSL1, a first transistor T41, a fourth organic light emitting diode B_OLED, a second transistor T42, a fourth storage capacitor CST4 and a third transistor T43.

The second transistor T42 is connected to a first scan line SL1, a fourth data line DL4 and a first transistor T41. The third transistor T43 is connected to a first sensing scan line SSL1, a first sensing line SDL1 and a fourth organic light emitting diode B_OLED.

During an image display period in which the organic light emitting display device emits a light, a method of driving the unit pixel circuit PUC is explained.

Referring to FIGS. 1 and 3, the voltage generator 160 generates an initial voltage VINT having the level determined from the initial voltage determining part 150, and provides the sensing part 133 with the initial voltage VINT. In addition, the voltage generator 160 provides the display part 110 with a first power source voltage ELVDD and a second power source voltage ELVSS.

The sensing part 133 outputs the initial voltage VINT having the level determined by every frame to a plurality of sensing lines SDL1, SDL2, . . . , SDLm.

The first scan driver 131 generates a plurality of scan signals SC1, SC2, . . . , SCN and sequentially outputs the plurality of scan signals SC1, SC2, . . . , SCN to the plurality of scan lines SL1, SL2, . . . , SLN.

The second scan driver 133 generates a plurality of sensing scan signals SS1, SS2, . . . , SSn and sequentially outputs the plurality of sensing scan signals SS1, SS2, . . . , SSn to the plurality of sensing scan lines SSL1, SSL2, . . . , SSLn.

The data driver 131 generates data voltages of the frame and outputs the data voltages to the plurality of data lines DL1, DL2, . . . , DLM by every horizontal period.

Referring to FIGS. 2 and 3, in a first period t1, a first sensing scan line SSL1 receives an on voltage of a first sensing scan signal, and a first sensing line SDL1 receives an initial voltage VINT having the level determined by every frame.

The red, white, green and blue pixel circuits R_PC, W_PC, G_PC, and B_PC receive the initial voltage VINT applied to the initial voltage VINT through the third transistors T13, T23, T33, and T43 which are turned on in response to the on voltage of the first sensing scan signal.

Therefore, in each of the red, white, green, and blue pixel circuits R_PC, W_PC, G_PC and B_PC, the first, second, third, and fourth organic light emitting diodes R_OLED, W_OLED, G_OLED and B_OLED and the first, second, third, and fourth storage capacitors CST1, CST2, CST3, and CST4 are initialized by the initial voltage VINT.

In a second period t2, the first scan line SL1 receives the on voltage of the first scan signal, and first, second, third, and fourth data lines DL1, DL2, DL3, and DL4 receive first, second, third, and fourth data voltages, respectively.

The red, white, green, and blue pixel circuits R_PC, W_PC, G_PC, and B_PC receive the first, second, third, and fourth data voltages respectively applied to the first, second, third, and fourth data lines DL1, DL2, DL3, and DL4 through the second transistors T12, T22, T32, and T42, respectively, which are turned on in response to the on voltage of the first scan signal.

For example, referring to the red pixel circuit R_PC, the first data voltage applied to the first data line DL1 is applied to the control electrode of the first transistor T11, and stores in the first storage capacitor CST1. The first transistor T11 is turned on based on the first data voltage and a driving current corresponding to a gate/source voltage Vgs of the first transistor T11 is applied to the anode electrode of the first organic light emitting diode R_OLED.

The first organic light emitting diode R_OLED emits a red light corresponding to a difference voltage between the first data voltage and the initial voltage VINT and thus may display a red image.

As described above, the second, third, and fourth organic light emitting diodes W_OLED, G_OLED and B_OLED in the white, green and blue pixel circuits W_PC, G_PC, and B_PC may display color images.

In a sensing period in which the organic light emitting display device senses a sensing signal from unit pixel circuit PUC, a method of driving the unit pixel circuit PUC is explained. The sensing period may be reset in a vertical blank period of a frame period, a power off period, a user setting period, etc.

In a first period, the first scan line SL1 receives an on voltage of the first scan signal, the first sensing scan line SSL1 receives an off voltage of the first sensing scan signal, and the first, second, third, and fourth data lines DL1, DL2, DL3, and DL4 receive a reset voltage. The reset voltage is a reference voltage for resetting the red, white, green, and blue pixel circuits R_PC, W_PC, G_PC, and B_PC.

The red, white, green, and blue pixel circuits R_PC, W_PC, G_PC, and B_PC receives the reset voltage through the second transistors T12, T22, T32, and T42 which are turned on, and then the first, second, third, and fourth organic light emitting diodes R_OLED, W_OLED, G_OLED, and B_OLED and first, second, third, and fourth storage capacitors CST1, CST2, CST3, and CST4 may reset by the reset voltage.

In a second period, the first scan line SL1 receives an on voltage of the first scan signal, the first sensing scan line SSL1 receives an off voltage of the first sensing scan signal and the first, second, third and fourth data lines DL1, DL2, DL3, and DL4 receive sampling voltages.

The sampling voltages are reference voltages for forming sensing signals of the red, white, green, and blue pixel circuits R_PC, W_PC, G_PC, and B_PC.

The red, white, green, and blue pixel circuits R_PC, W_PC, G_PC, and B_PC receive the sampling voltages through the second transistors T12, T22, T32, and T42 which are turned on, and the sampling voltages is applied to the first, second, third and fourth organic light emitting diodes R_OLED, W_OLED, G_OLED, B_OLED and the first, second, third and fourth storage capacitors CST1, CST2, CST3, and CST4.

The red, white, green, and blue pixel circuits R_PC, W_PC, G_PC, and B_PC may form the sensing signals based on the sampling voltages.

In a third period, the first scan line SL1 receives an off voltage of the first scan signal and the first sensing scan line SSL1 receives an on voltage of the first sensing scan signal.

The sensing signals formed in the red, white, green, and blue pixel circuits R_PC, W_PC, G_PC and B_PC are applied to the first sensing line SDL1 through the third transistors T13, T23, T33, and T43 which are turned on.

The sensing signal may correspond to a threshold voltage of the first transistor or a driving current applied to the organic light emitting diode.

Figure 4A:
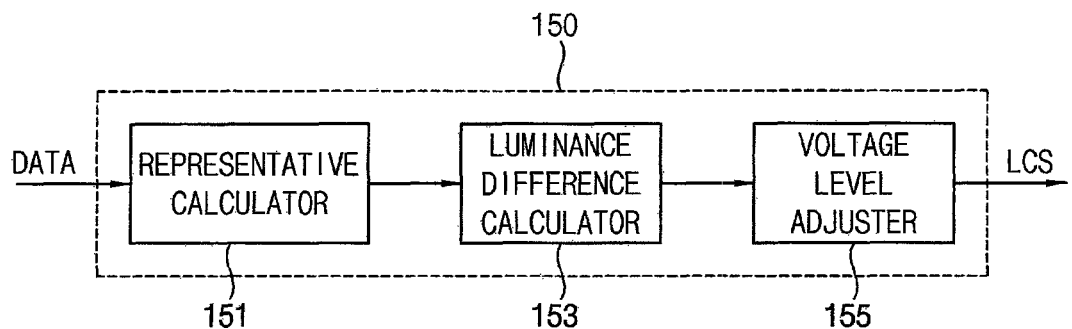
FIG. 4A is a block diagram illustrating an initial voltage determining part according to some example embodiments.
Figure 4B:
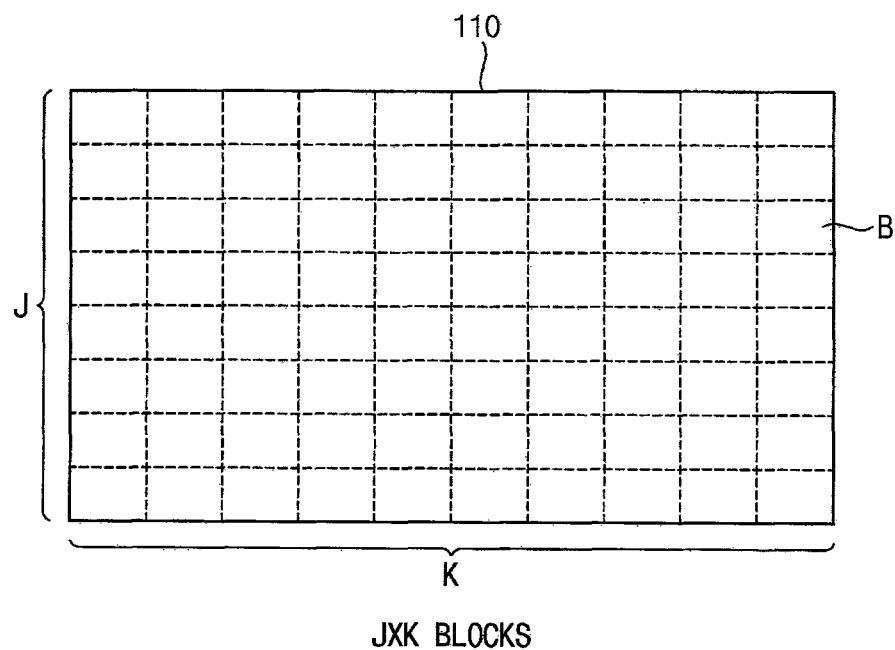
FIG. 4B is a conceptual diagram illustrating a display panel according to some example embodiments.

FIG. 4A is a block diagram illustrating an initial voltage determining part according to some example embodiments. FIG. 4B is a conceptual diagram illustrating a display panel according to some example embodiments.

Referring to FIGS. 1, 4A and 4B, the initial voltage determining part 150 may include a representative calculator 151, a luminance difference calculator 153, and a voltage level adjuster 155.

The representative calculator 151 divides the image data of the frame into a plurality of blocks (J×K) (wherein, 'J' and 'K' are natural numbers). The representative calculator 151 analyzes image data of a block B and calculates a representative luminance value of the block B.

The representative luminance value of the block B may be determined, for example, as an average luminance value, a minimum luminance value, or a maximum luminance value, etc. of the block B. The representative calculator 151 calculates a plurality of representative luminance values respectively corresponding to a plurality of blocks by every frame.

The luminance difference calculator 153 calculates a maximum luminance value and a minimum luminance value using the plurality of representative luminance values of the plurality of block. The luminance difference calculator 153 calculates a luminance difference value between the maximum luminance value and the minimum luminance value.

The voltage level adjuster 155 determines the level of the initial voltage VINT applied to the display part 110 based on the luminance difference value.

For example, when the luminance difference value of the frame is in a reference range, the level of the initial voltage VINT may be determined to be a normal level.

When the luminance difference value of the frame is over the reference range, the level of the initial voltage VINT may be determined to be a low level that is lower than the normal level.

When the luminance difference value of the frame is below the reference range, the level of the initial voltage VINT may be determined to be a high level that is higher than the normal level.

As described above, the level of the initial voltage is determined to high, normal or low level and not limited thereto. The level of the initial voltage may be determined to be a plurality of levels, variously.

Figure 5A:
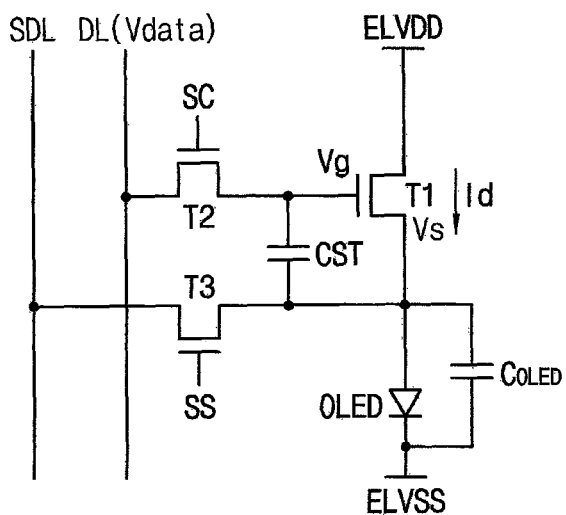
FIG. 5A is a circuit diagram illustrating a pixel circuit according to some example embodiments.
Figure 5B:
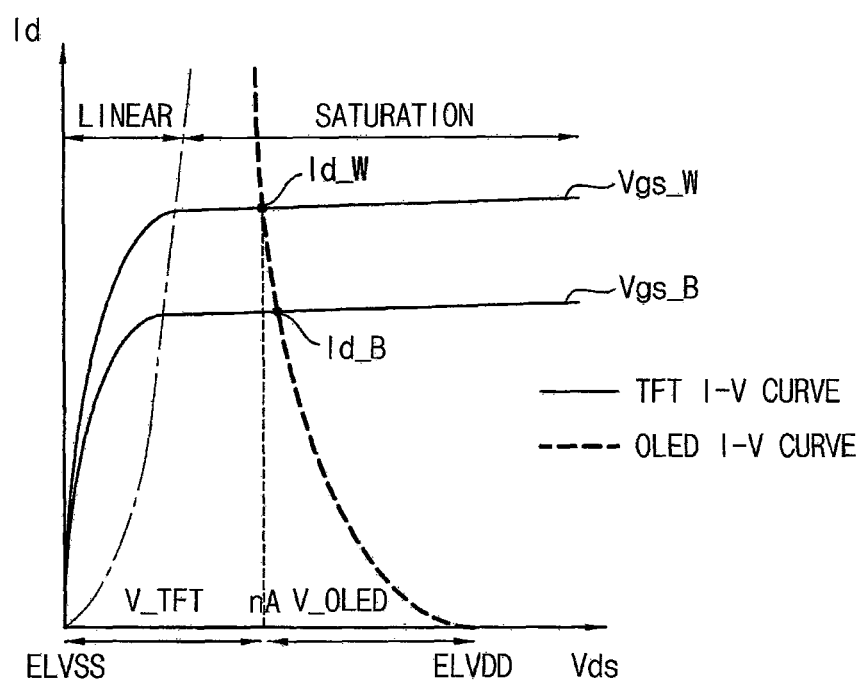
FIG. 5B is an I-V characteristic curve illustrating a method of displaying a first compound image according to some example embodiments.

FIG. 5A is a circuit diagram illustrating a pixel circuit according to some example embodiments. FIG. 5B is an I-V characteristic curve illustrating a method of displaying a first compound image according to some example embodiments.

Referring to FIG. 5A, the pixel circuit PC may include a first transistor T1, a second transistor T2 and a third transistor T3 of an NMOS (N-channel metal oxide semiconductor)-type. The first, second and third transistors T1, T2, and T3 are driven in a saturation region.

A driving current Id is applied to the organic light emitting diode OLED according to a gate/source voltage Vgs between a gate voltage Vg and a source voltage Vs of the first transistor T1.

In the pixel circuit PC, the driving current Id is applied to the organic light emitting diode OLED according to the data voltage Vdata of the data line DL and the initial voltage VINT of the sensing line SDL. The driving current Id may be defined as the following Equation.

$$Vg = Vdata, \ Vs = VINT + Vel + ELVSS \qquad \text{Equation}$$

$$Vgs = Vdata - (VINT + Vel + ELVSS)$$

$$Id = \frac{k}{2}(Vdata - VINT - ELVSS - Vel - Vth)^2$$

In Equation, 'Vel' is an OLED voltage, 'Vth' is a threshold voltage of the first transistor and 'k' is a proportional constant.

Referring to Equation, the driving current Id may be changed by the initial voltage VINT, the power source voltage ELVSS and an I-V characteristic of the organic light emitting diode.

Referring to Equation and FIG. 5B, when a white voltage being a highest grayscale voltage is applied to the first transistor T1, a white current Id_W of a highest current may be applied to the organic light emitting diode OLED according to a gate/source voltage Vgs_W corresponding to the white voltage and the initial voltage VINT.

However, when a black voltage being a lowest grayscale voltage is applied to the first transistor T1, a black current Id_B of a lowest current may be applied to the organic light emitting diode OLED according to a gate/source voltage Vgs_B corresponding to the black voltage and the initial voltage VINT.

The organic light emitting diode OLED may display a plurality of grayscales in a current range which is from black current Id_B to the white current Id_W. When the current range between the white current Id_W and the black current Id_B increases, a grayscale expression of the image may be clear. Thus, the display quality of the image may be improved.

As described above, the driving current Id applied to the organic light emitting diode OLED may be changed by the level of the initial voltage VINT. For example, the driving current Id may increase when the level of the initial voltage VINT decreases and the driving current Id may decrease when the level of the initial voltage VINT increases.

According to some example embodiments, the level of initial voltage applied to the pixel circuit is changed by every frame based on a luminance characteristic of a frame image and thus, the driving current applied to the organic light emitting diode may be adjusted. Thus, a luminance characteristic by every frame image may be improved.

Figure 6A:
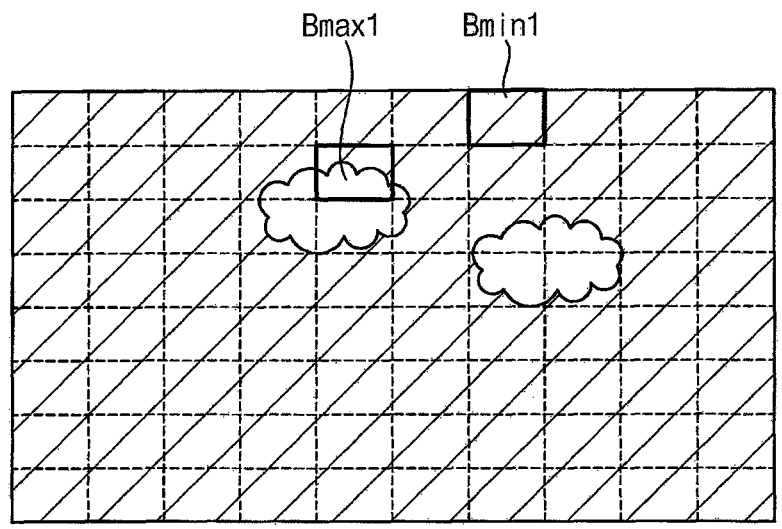
FIG. 6A is a conceptual diagram illustrating a method of displaying a first compound image according to some example embodiments.
Figure 6B:
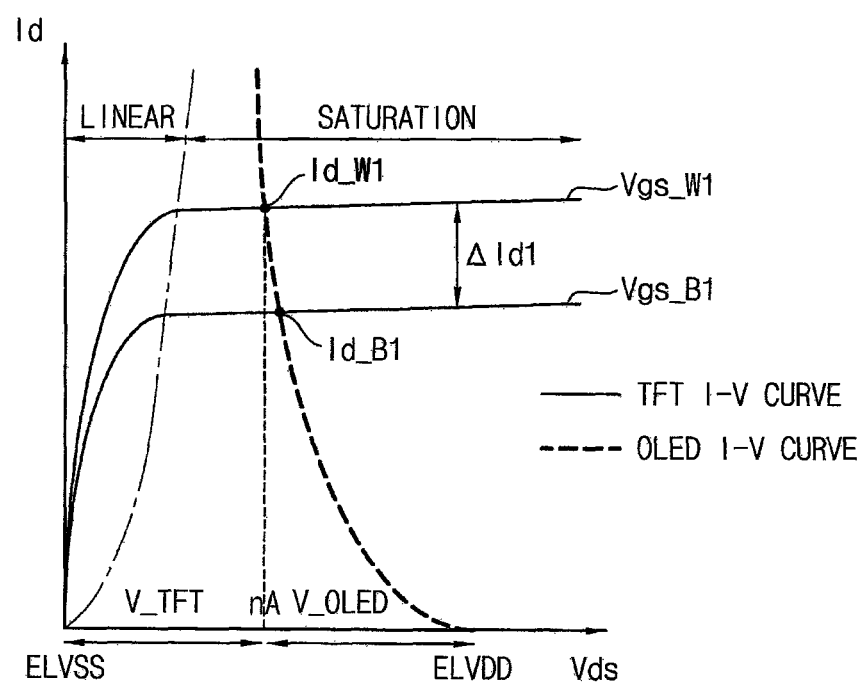
FIG. 6B is an I-V characteristic curve illustrating a method of displaying a first compound image according to some example embodiments.

FIG. 6A is a conceptual diagram illustrating a method of displaying a first compound image according to some example embodiments. FIG. 6B is an I-V characteristic curve illustrating a method of displaying a first compound image according to some example embodiments.

Referring to FIG. 6A, image data of a first frame FI1 include a first maximum luminance block Bmax1 having a first maximum luminance value and a first minimum luminance block Bmin1 having a first minimum luminance value. A first luminance difference value between the first maximum luminance value and the first minimum luminance value is in the reference range.

Thus, the initial voltage VINT of the first frame FI1 may be determined to be a first initial voltage VINTR of the normal level.

Referring to FIG. 6B, a first transistor in a pixel circuit displaying a white grayscale of the first frame FI1 has a first white gate/source voltage Vgs_W1 corresponding to a difference voltage between the white voltage Vdata_W and the first initial voltage VINTR as Equation.

A first white current Id_W1 corresponding to the first white gate/source voltage Vgs_W1 is applied to the organic light emitting diode OLED. The organic light emitting diode OLED may display a normal white.

A first transistor in a pixel circuit displaying a black grayscale of the first frame FI1 has a first black gate/source voltage Vgs_B1 corresponding to a difference voltage between the black voltage Vdata_B and the first initial voltage VINTR as Equation.

A first black current Id_B1 corresponding to the first black gate/source voltage Vgs_B1 is applied to the organic light emitting diode OLED. The organic light emitting diode OLED may display a normal black.

Figure 7A:
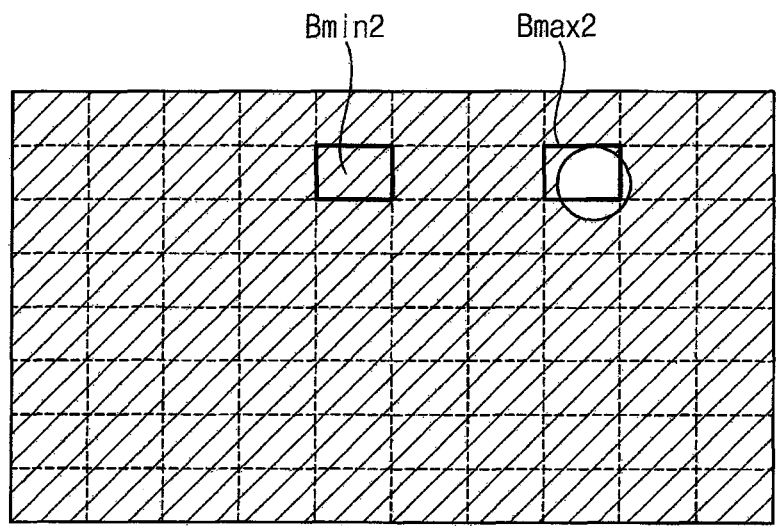
FIG. 7A is a conceptual diagram illustrating a method of displaying a second compound image according to some example embodiments.
Figure 7B:
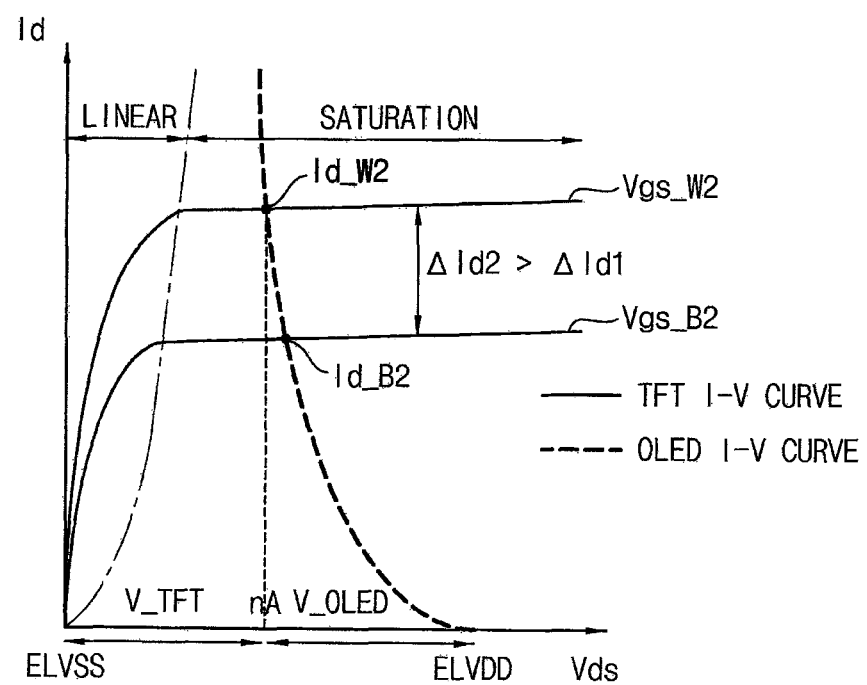
FIG. 7B is an I-V characteristic curve illustrating a method of displaying a second compound image according to some example embodiments.

FIG. 7A is a conceptual diagram illustrating a method of displaying a second compound image according to some example embodiments. FIG. 7B is an I-V characteristic curve illustrating a method of displaying a second compound image according to some example embodiments.

Referring to FIG. 7A, image data of a first frame FI2 include a second maximum luminance block Bmax2 having a second maximum luminance value and a second minimum luminance block Bmin2 having a second minimum luminance value. A second luminance difference value between the second maximum luminance value and the second minimum luminance value is over the reference range. The first frame FI2 is an image having a large contrast ratio.

Therefore, a level of a second initial voltage VINTL corresponding to the second frame FI2 may be determined to be a low level that is lower than the normal level.

Referring to FIG. 7B, a first transistor in a pixel circuit displaying a white grayscale of the second frame FI2 has a second white gate/source voltage Vgs_W2 corresponding to a difference voltage between the white voltage Vdata_W and the second initial voltage VINTL as Equation.

A second white current Id_W2 corresponding to the second white gate/source voltage Vgs_W2 is applied to the organic light emitting diode OLED. The organic light emitting diode OLED may display a high luminance white higher than the normal white.

A first transistor in a pixel circuit displaying a black grayscale of the second frame FI2 has a second black gate/source voltage Vgs_B2 corresponding to a difference voltage between the black voltage Vdata_B and the second initial voltage VINTL as Equation.

A second black current Id_B2 corresponding to the second black gate/source voltage Vgs_B2 is applied to the organic light emitting diode OLED. The organic light emitting diode OLED may display a black of a different luminance from a normal black.

In comparison with FIGS. 6A and 6B, a second difference current ΔId2 between the second white current Id_W2 and the second black current Id_B2 may be more than a first difference current ΔId1 between the first white current Id_W1 and the first black current Id_B1.

Therefore, the second white current Id_W2 is more than the first white current Id_W1 and thus, a white image of the second frame FI2 has a high luminance higher than a luminance of a white image of the first frame FI1. The contrast ratio of the second frame FI2 is more than that of the first frame FI1 and thus, a clear image may be displayed.

Figure 8A:
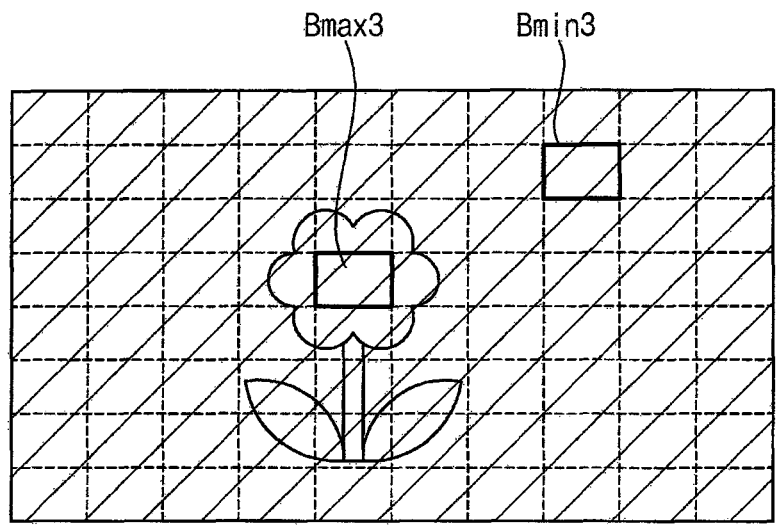
FIG. 8A is a conceptual diagram illustrating a method of displaying a third compound image according to some example embodiments.
Figure 8B:
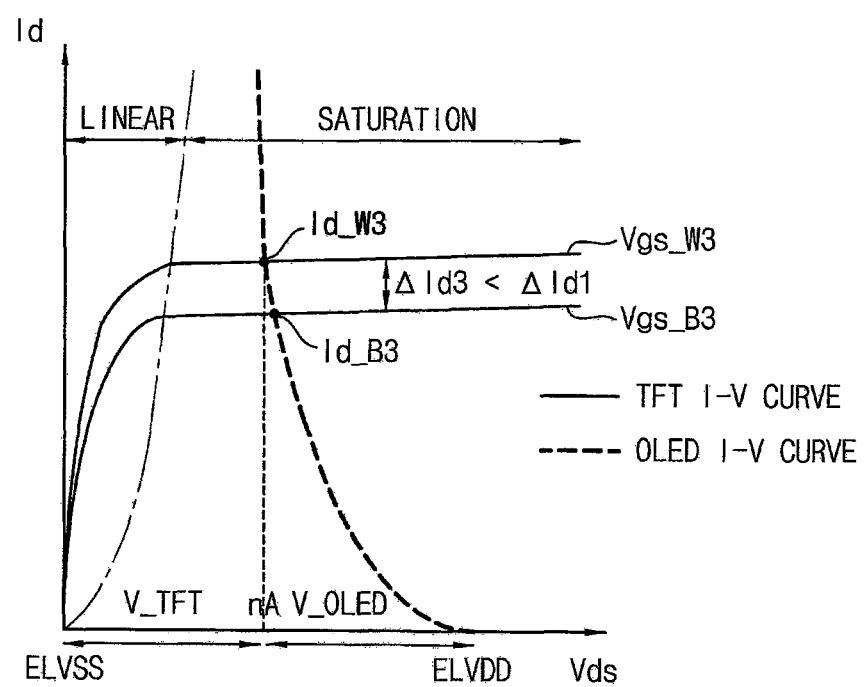
FIG. 8B is an I-V characteristic curve illustrating a method of displaying a third compound image according to some example embodiments.

FIG. 8A is a conceptual diagram illustrating a method of displaying a third compound image according to some example embodiments. FIG. 8B is an I-V characteristic curve illustrating a method of displaying a third compound image according to some example embodiments.

Referring to FIG. 8A, image data of a third frame FI3 include a third maximum luminance block Bmax3 having a third maximum luminance value and a third minimum luminance block Bmin3 having a third minimum luminance value. A third luminance difference value between the third maximum luminance value and the third minimum luminance value is below the reference range.

Therefore, a level of a third initial voltage VINTH corresponding to the third frame FI3 may be determined to be a high level, higher than the normal level.

Referring to FIG. 8B, a first transistor in a pixel circuit displaying a white grayscale of the third frame FI3 has a third white gate/source voltage Vgs_W3 corresponding to a difference voltage between the white voltage Vdata_W and the third initial voltage VINTH.

A third white current Id_W3 corresponding to the third white gate/source voltage Vgs_W3 is applied to the organic light emitting diode OLED. The organic light emitting diode OLED may display a low luminance white lower than the normal white.

A first transistor in a pixel circuit displaying a black grayscale of the third frame FI3 has a third black gate/source voltage Vgs_B3 corresponding to a difference voltage between the black voltage Vdata_B and the third initial voltage VINTH.

A third black current Id_B3 is applied to the organic light emitting diode OLED corresponding to the third black gate/source voltage Vgs_B3. The organic light emitting diode OLED may display a black of a luminance equal to or lower than a luminance of the normal black.

In comparison with FIGS. 6A and 6B, a third difference current ΔId3 between the third white current Id_W3 and the third black current Id_B3 may be less than a first difference current ΔId1 between the first white current Id_W1 and the first black current Id_B1.

Therefore, the third white current Id_W3 is less than the first white current Id_W1 and thus, a white image of the third frame FI3 has a low luminance lower than a luminance of a white image of the first frame FI1.

Therefore, in the third frame FI3 having a small luminance difference, dazzling may decrease and thus, the display quality may be improved.

Figure 9:
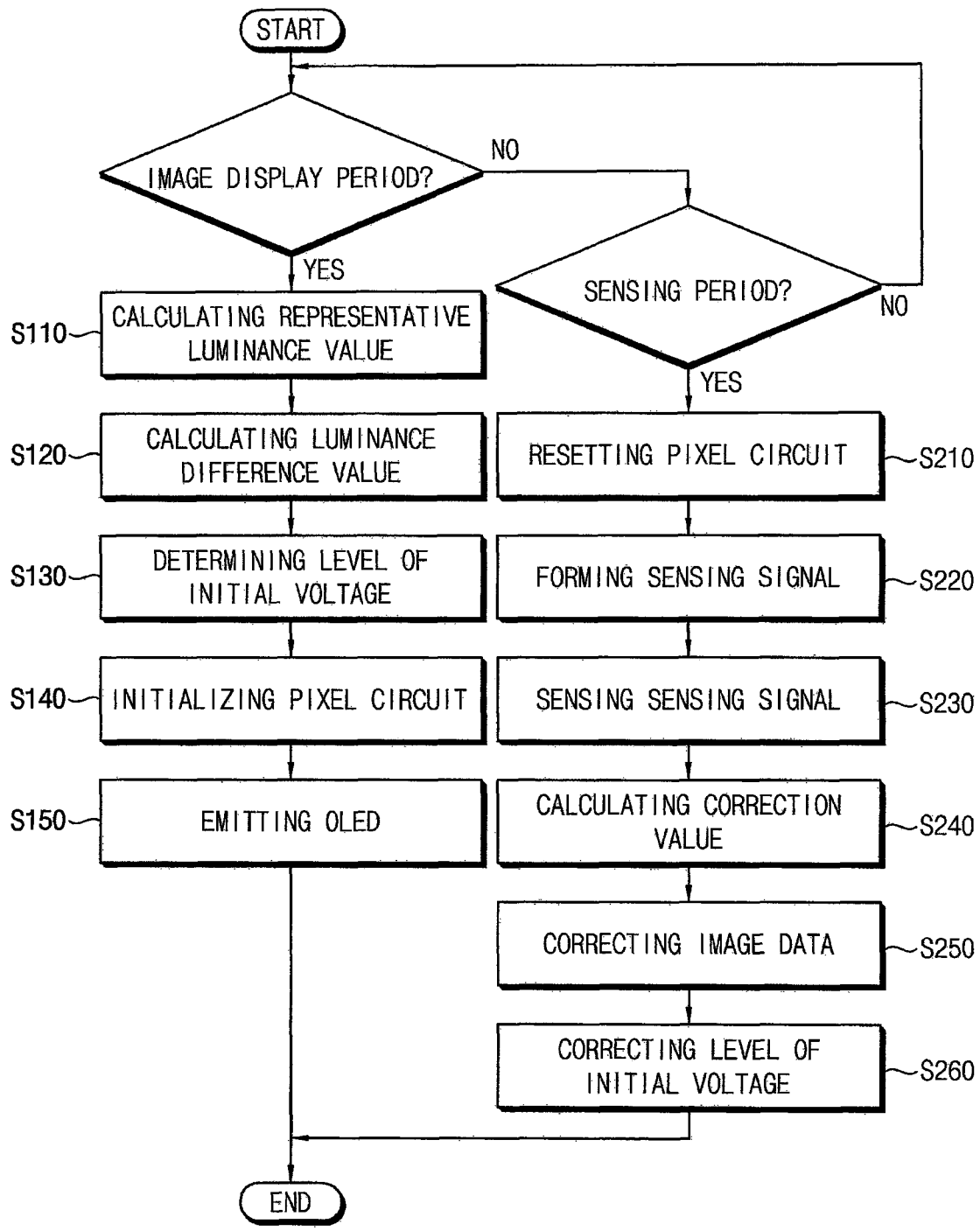
FIG. 9 is a flowchart diagram illustrating a method of driving an organic light emitting display device according to some example embodiments.

FIG. 9 is a flowchart diagram illustrating a method of driving an organic light emitting display device according to some example embodiments. According to various embodiments, certain operations illustrated with respect to FIG. 9 may be omitted or additional operations may be included, and the order of operations may vary according to some embodiments, unless otherwise indicated.

Referring to FIGS. 1, 4 and 9, in the image display period of the organic light emitting display device, the representative calculator 151 divides the image data of the frame into a plurality of blocks, analyzes image data of a block B and calculates a representative luminance value of the block B and calculates a plurality of representative luminance values respectively corresponding to a plurality of blocks by every frame (Step S110).

The representative luminance value may be determined as an average luminance value, a minimum luminance value or a maximum luminance value, etc.

The luminance difference calculator 153 calculates a maximum luminance value and a minimum luminance value using the plurality of representative luminance values of the plurality of block and calculates a luminance difference value between the maximum luminance value and the minimum luminance value (Step S120).

The voltage level adjuster 155 determines the level of the initial voltage VINT applied to the display part 110 based on the luminance difference value (Step S130).

For example, the luminance difference value of the frame is in a reference range, the level of the initial voltage VINT may be determined to be a normal level. When the luminance difference value of the frame is over the reference range, the level of the initial voltage VINT may be determined to be a low level that is lower than the normal level. When the luminance difference value of the frame is below the reference range, the level of the initial voltage VINT may be determined to be a high level that is higher than the normal level.

The voltage generator 160 generates the initial voltage VINT having the level determined from the voltage level adjuster 155 and provides the sensing part 133 with the initial voltage VINT.

The sensing part 133 provides the pixel circuit PC with the initial voltage VINT through the sensing line SDL. The second scan driver 143 sequentially outputs the plurality of sensing scan signals to the plurality of sensing scan lines SSL1, SSL2, . . . , SSLn.

Therefore, the pixel circuit PC may be initialized by the initial voltage VINT (Step S140).

Then, the data driver 131 provides the pixel circuit PC with the data voltage through the data line DL. The first scan driver 141 sequentially outputs the plurality of scan signals to the plurality of scan lines SL1, SL2, . . . , SLN.

Therefore, the organic light emitting diode OLED in the pixel circuit PC emits a light by the driving current corresponding to a difference voltage between the data voltage and the initial voltage (Step S150).

In the sensing period of the organic light emitting display device, the sensing part 133 provides the pixel circuit PC with the reset voltage through the sensing line SDL. The second scan driver 143 sequentially outputs the plurality of sensing scan signals to the plurality of sensing scan lines SSL1, SSL2, . . . , SSLn.

Therefore, the pixel circuit PC may be reset by the reset voltage (Step S210).

Then, the sensing part 133 provides the pixel circuit PC with a sampling voltage through the sensing line SDL. The second scan driver 143 sequentially outputs the plurality of sensing scan signals to the plurality of sensing scan lines SSL1, SSL2, . . ., SSLn.

Therefore, the pixel circuit PC may form a sensing signal corresponding to the sampling voltage (Step S220). The sensing signal may correspond to the threshold voltage of the first transistor T1 in the pixel circuit.

Then, the sensing part 133 receives the sensing signal from the pixel circuit PC through the sensing line SDL, and analog-to-digital converts the sensing signal to sensing data (Step S220).

The timing controller 120 calculates a correction value for correcting the image data using the sensing data (Step S240).

The timing controller 120 corrects the image data using the correction value and provides the data driver 131 with the corrected image data (Step S250).

In addition, according to some example embodiments, the initial voltage determining part 150 may correct the level of the initial voltage VINT using the correction value (Step S260).

As described above, the driving current Id may be changed by a threshold voltage Vth of the first transistor T1. The correction value is a value for compensating shifted threshold voltage.

Therefore, the level of the initial voltage VINT may be corrected based on the correction value.

The level of initial voltage applied to the pixel circuit is changed by every frame based on a luminance characteristic of a frame image and thus, the driving current applied to the organic light emitting diode may be adjusted. Thus, a luminance characteristic of the frame image may be improved by every frame.

According to some example embodiments, in the image display period, the level of initial voltage applied to the pixel circuit is changed by every frame based on a luminance characteristic of a frame image and thus, a display quality may be improved.

Aspects of some example embodiments of the present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of the inventive concept and is not to be construed as limiting thereof. Although a few example embodiments of the inventive concept have been described, those skilled in the art will readily appreciate that many modifications are possible in the example embodiments without materially departing from the novel teachings and aspects of the inventive concept. Accordingly, all such modifications are intended to be included within the scope of the inventive concept as defined in the claims, and their equivalents. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific example embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. An organic light emitting display device comprising:
  a display part comprising a plurality of pixel circuits,
  a pixel circuit from among the pixel circuits comprising:
    an organic light emitting diode; and
    a first transistor, the first transistor comprising a first electrode configured to receive a power source voltage and a second electrode connected to the organic light emitting diode;
  a representative calculator configured to divide image data of a frame into a plurality of blocks that correspond to a matrix of sub-areas of the frame and to calculate a plurality of representative luminance values that are representative of the luminance values of corresponding ones of the plurality of blocks;
  an initial voltage determiner configured to change a level of an initial voltage using the image data of the frame based on a luminance difference value between a maximum representative luminance value and a minimum representative luminance value of the plurality of blocks of the frame;
  a sensor configured to apply the initial voltage to the second electrode of the first transistor in response to a scan signal supplied by a second scan driver controlled by a first control signal; and
  a data driver configured to apply a data voltage to a control electrode of the first transistor in response to a scan signal supplied by a first scan driver different from the second scan driver and controlled by a second control signal.

2. The organic light emitting display device of claim 1, wherein the pixel circuit further comprises:
  a second transistor comprising a control electrode connected to a scan line, a first electrode connected to a data line and a second electrode connected to the control electrode of the first transistor; and
  a third transistor comprising a control electrode connected to a sensing scan line, a first electrode connected to a sensing line, and a second electrode connected to the second electrode of the first transistor.

3. The organic light emitting display device of claim 1, wherein the pixel circuit further comprises a storage capacitor connected between the control electrode of the first transistor and the second electrode of the first transistor.

4. The organic light emitting display device of claim 2, wherein the sensing line is configured to transfer the initial voltage to the pixel circuit, wherein multiple ones of the pixel circuits adjacent to the pixel circuit share the sensing line.

5. The organic light emitting display device of claim 2, further comprising:
  the first scan driver configured to:
    generate a scan signal having a first on voltage period in which the second transistor is turned on; and
    apply the scan signal to the scan line; and
  the second scan driver configured to:
    generate a sensing scan signal having a second on voltage period prior to the first on voltage period in which the third transistor is turned on; and
    apply the sensing scan signal to the sensing scan line.

6. The organic light emitting display device of claim 5, wherein the second on voltage period of the sensing scan signal has a first period and a second period, wherein the first period is prior to the first on voltage period and the second period overlaps with the first on voltage period.

7. The organic light emitting display device of claim 1, wherein the initial voltage determiner comprises:
  a luminance difference calculator configured to calculate the maximum luminance value and the minimum luminance value of the representative luminance values and calculate the luminance difference value between the maximum luminance value and the minimum luminance value; and
  a voltage level adjuster configured to adjust the level of the initial voltage based on the luminance difference value of the frame.

8. The organic light emitting display device of claim 7, wherein the voltage level adjuster is configured to:
  decrease the level of the initial voltage when the luminance difference value of the frame increases; and
  increase the level of the initial voltage when the luminance difference value of the frame decreases.

9. The organic light emitting display device of claim 1, wherein the sensor is configured to:
  receive a sensing signal corresponding to a threshold voltage of the first transistor from the pixel circuit; and
  analog to digital convert the sensing signal to a sensing data.

10. The organic light emitting display device of claim 9, further comprising:
  a timing controller configured to calculate a correction value for compensating the threshold voltage of the first transistor using the sensing data and to generate corrected image data based on the correction value.

11. The organic light emitting display device of claim 10, wherein the initial voltage determiner is configured to correct the level of the initial voltage based on the correction value.

12. A method of driving an organic light emitting display device, the organic light emitting display device comprising:
  a display part comprising a plurality of pixel circuits, wherein a pixel circuit of the pixel circuits comprises an organic light emitting diode and a first transistor, the first transistor comprising a first electrode configured to receive a power source voltage and a second electrode connected to the organic light emitting diode, the method comprising:
  dividing image data of a frame into a plurality of blocks that correspond to a matrix of sub-areas of the frame and calculating a plurality of representative luminance values that are representative of the luminance values of corresponding ones of the plurality of blocks;

changing a level of an initial voltage using image data of the frame based on a luminance difference value between a maximum representative luminance value and a minimum representative luminance value of the plurality of representative luminance values of the plurality of blocks of the frame;

applying the changed initial voltage the second electrode of the first transistor in response to a scan signal supplied by a second scan driver controlled by a first control signal; and applying a data voltage to a control electrode of the first transistor in response to a scan signal supplied by a first scan driver different from the second scan driver and controlled by a second control signal.

13. The method of claim 12, wherein the pixel circuit further comprises:
- a second transistor comprising a control electrode connected to a scan line, a first electrode connected to a data line and a second electrode connected to a control electrode of the first transistor; and
- a third transistor comprising a control electrode connected to a scan line, a first electrode connected to a sensing line and a second electrode connected to the second electrode of the first transistor, and the method further comprises:
- applying a scan signal having a first on voltage period in which the second transistor is turned on, to the scan line; and
- applying a sensing scan signal having a second on voltage period prior to the first on voltage period in which the third transistor is turned on, to a sensing scan line.

14. The method of claim 13, wherein the second on voltage period of the sensing scan signal has a first period and a second period, wherein the first period is prior to the first on voltage period and the second period is overlapped with the first on voltage period.

15. The method of claim 13, wherein the initial voltage is applied to the pixel circuit through the sensing line, and a plurality of pixel circuits adjacent to the pixels circuit shares the sensing line.

16. The method of claim 12, wherein changing the level of the initial voltage comprises:
- calculating the maximum luminance value and the minimum luminance value of the representative luminance values and calculate the luminance difference value between the maximum luminance value and the minimum luminance value; and
- adjusting the level of the initial voltage based on the luminance difference value of the frame.

17. The method of claim 16, further comprising:
- decreasing the level of the initial voltage when the luminance difference value of the frame increases, and
- increasing the level of the initial voltage when the luminance difference value of the frame decreases.

18. The method of claim 12, further comprising:
- receiving a sensing signal corresponding to a threshold voltage of the first transistor from the pixel circuit; and
- analog to digital converting the sensing signal to a sensing data.

19. The method of claim 18, further comprising:
- calculating a correction value for compensating the threshold voltage of the first transistor using the sensing data; and
- generating corrected image data based on the correction value.

20. The method of claim 19, further comprising:
- correcting the level of the initial voltage based on the correction value.

\* \* \* \* \*